(12) United States Patent
Huang et al.

(10) Patent No.: US 11,953,794 B2
(45) Date of Patent: *Apr. 9, 2024

(54) LIQUID CRYSTAL ON SILICON PANEL, AND PREPARATION METHOD THEREOF

(71) Applicant: Advanced Silicon Display Optoelectronics Corporation Ltd., Shenzhen (CN)

(72) Inventors: Kuo-Lung Huang, Shenzhen (CN); Rong Hsu, Shenzhen (CN)

(73) Assignee: Advanced Silicon Display Optoelectronics Corporation Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/671,808

(22) Filed: Feb. 15, 2022

(65) Prior Publication Data

US 2022/0320148 A1 Oct. 6, 2022

(30) Foreign Application Priority Data

Mar. 31, 2021 (CN) .......................... 202110349791.9

(51) Int. Cl.
*G02F 1/1362* (2006.01)
*G02F 1/1333* (2006.01)
*H01L 27/12* (2006.01)

(52) U.S. Cl.
CPC .. *G02F 1/136277* (2013.01); *G02F 1/133351* (2013.01); *H01L 27/1218* (2013.01)

(58) Field of Classification Search
CPC ......... G02F 1/136277; G02F 1/133351; G02F 2201/42; G02F 1/1339; G02F 1/1345; G02F 1/1341; G02F 2001/13415; G02F 1/1333; G02F 1/133302; G02F 1/13306; H01L 27/1218; H01L 21/76898; H01L 21/78; H01L 27/1262
See application file for complete search history.

(56) References Cited

U.S. PATENT DOCUMENTS

| | | | | |
|---|---|---|---|---|
| 2003/0197816 A1* | 10/2003 | Winer | ................... | G02F 1/1341 257/E21.597 |
| 2006/0043154 A1* | 3/2006 | Kirby | ..................... | B23K 1/085 228/37 |
| 2011/0280573 A1* | 11/2011 | Collings | ................. | G02F 1/295 349/193 |
| 2014/0085579 A1* | 3/2014 | Fan | ....................... | G02F 1/1337 349/122 |
| 2017/0106476 A1* | 4/2017 | Sakamoto | ............ | B23K 26/064 |
| 2018/0152657 A1* | 5/2018 | Miyazawa | .......... | H01L 27/1469 |

* cited by examiner

*Primary Examiner* — Jia X Pan
(74) *Attorney, Agent, or Firm* — ScienBiziP, P.C.

(57) ABSTRACT

A preparation method of an LCoS panel provides a wafer substrate at a wafer level, the substrate including die areas with active circuits. A seal is formed on the wafer substrate, coupling to a transparent substrate. Vias extend through a thick silicon substrate and there are conductive interfaces on the second surface in each die area, the active circuit being connected to the back side of the wafer substrate by the vias and the conductive interfaces. The wafer substrate and the transparent substrate are cut to obtain LCoS panels. These processes (especially the circuit packaging) are all performed at wafer level, improving production efficiency and reducing production cost. An LCoS panel so prepared is also disclosed.

15 Claims, 9 Drawing Sheets

LIQUID CRYSTAL ON SILICON PANEL, AND PREPARATION METHOD THEREOF

TECHNICAL FIELD

The present disclosure generally relates to the field of semiconductor technology, in particular to a liquid crystal on silicon (LCoS) panel and a preparation method of the LCoS panel.

BACKGROUND

Wafer level packaging (WLP) is an efficient method for mass production of chips. Compared with simple integrated circuit chips, LCoS panels include not only integrated circuits, but also liquid crystal packaging structures. To build a complete LCoS wafer level packaging production line, not only is a section for implementing integrated circuit packaging required, but also a section for implementing liquid crystal packaging.

At present, the steps of mass production of LCoS panels are as follows: manufacturing hundreds of integrated circuits with dies on a wafer substrate; applying a seal on each die and then attaching the wafer substrate to a transparent substrate; cutting the wafer substrate and transparent substrate in a staggered fashion to form hundreds of independent units, so that a front edge of the wafer substrate of the cut unit exposes the reserved solder pads; injecting liquid crystal to the port left on a side of the seal and sealing the port; and circuit packaging, wherein wires are joined to the solder pads of each unit, leaded to a flexible circuit board (FPC), and connected to a control circuit board. In this technical solution, only the manufacturing of integrated circuits and transparent substrate packaging is at wafer level, while liquid crystal injection and circuit packaging (integrated circuit manufacturing is not included here) are at die-level, resulting in low production efficiency, and needing more manpower and material resources, resulting in high cost of a single LCoS, and competing with digital micromirror device (DMD) is more difficult.

Therefore, in order to reduce the mass production cost of LCoS, on the one hand, it is necessary to improve the process and introduce more advanced mass production processes. On the other hand, it is necessary to obtain more yield from a single wafer, which requires filling more dies in a standard wafer, and reducing a design size of the dies. However, the traditional LCoS pads are concentrated on an edge of the front side of the wafer substrate. If the size of each die is reduced and the number of solder pads/wires remains unchanged, wire bonding or wiring of thin film printed circuits becomes more and more difficult and time-consuming. More importantly, the signal transmission wires become thinner, resulting in lack of improvement in signal processing speeds.

Therefore, it is necessary to develop a new mass production solution for LCoS panels and the corresponding structure of LCoS panels.

SUMMARY

One aspect of the present disclosure provides a preparation method of a liquid crystal on silicon (LCoS) panel. The preparation method includes step A, step B, step C, and step D. The step A includes providing a wafer substrate. The wafer substrate includes a silicon substrate and a plurality of die areas defined by a plurality of intersecting dividing lines. The silicon substrate includes a first surface and a second surface opposite to the first surface. Each of the plurality of die areas includes an active circuit on the first surface, and the active circuit includes a pixel circuit area and a peripheral circuit area. The step B includes forming a seal on a side of the first surface in each of the plurality of die areas of the wafer substrate. The seal at least surrounds the pixel circuit area of the active circuit, and defines a liquid crystal space of each of the plurality of die areas where the seal is located. The step B further includes providing a transparent substrate including a transparent conductive layer, and coupling a surface of the transparent substrate with the transparent conductive layer and the wafer substrate by the seal. The step C includes thinning the silicon substrate to a first thickness ranging from 220 µm to 500 µm; manufacturing a plurality of vias extending through the first surface and the second surface in each of the plurality of die areas of the wafer substrate; and manufacturing a plurality of conductive interfaces on the second surface. Each of the plurality of conductive interfaces is arranged to correspond to one of the plurality of vias, and is electrically connected to the active circuit of one of the plurality of die areas where the conductive interface is located by a corresponding one of the plurality of vias. The step D includes cutting the wafer substrate along the plurality of dividing lines, and correspondingly cutting the transparent substrate to obtain a plurality of LCoS panels.

The preparation method of the LCoS panel brings the advantages of using through-silicon via (TSV) technology on the wafer substrate, which makes it possible to separate the front-end circuit packaging from the back-end liquid crystal packaging into two independent parts. Specifically, the liquid crystal space packaging process is mainly carried out on the front side of the wafer substrate (that is, a side of the first surface), which will not cause damage to the circuit packaging structure, and there is no need for additional circuit packaging on the front side of the wafer substrate during the process of liquid crystal space packaging. On the other hand, the circuit packaging process is mainly carried out on the back side of the wafer substrate, and the vias (metallized holes) extending through the silicon substrate are manufactured using TSV technology. The active circuits on the wafer substrate are electrically connected to the conductive interfaces on the back side of the wafer substrate (that is, the second surface) by the vias, thus the circuit packaging is completed. When the liquid crystal space packaging and the circuit packaging are completed, dicing and cutting steps can be performed to obtain a single LCoS panel, and there is no need for further die level packaging of the LCoS panel. The downstream processes only need to install directly on the external circuit substrate to obtain the LCoS module. In summary, the preparation method of the LCoS panel makes cost control, production planning, and output improvement easier.

Moreover, the process of manufacturing vias in the present disclosure is carried out on a thick silicon substrate (220 µm to 500 µm). On the one hand, a difficulty of manufacturing vias is reduced and the process mass production yield is improved. On the other hand, a thick silicon substrate helps to ensure the flatness of the reflective electrode layer of the active circuit during the preparation and working state of the LCoS panel. Since the LCoS panel is an image modulator, the optical flatness has a great influence on the uniformity of image transmission, which is the biggest difference between LCoS panels and other integrated circuit devices.

In addition, the TSV technology is used on the wafer substrate to form vias extending through the silicon substrate, so that the LCoS panel is directly connected to the external circuit substrate by the conductive interfaces on the back, and the LCoS module with compact package structure can be obtained. The overall size of the LCoS module is reduced, at the same time, the signal processing speed is increased, the signal distortion is small, and the total power consumption is low. The technical solution does not require FPC wires to connect the LCoS panel to the external circuit substrate, and can achieve mass production at an advantageous material cost. Moreover, the flow of current of the LCoS panel of the structure is perpendicular to the panel direction, which can allow an increased thinness. Generally, the LCoS panel of the structure has only a three-layer structure of a transparent substrate layer, a liquid crystal layer, and a wafer substrate layer. There is no need to set up redundant metal plates and heat sinks on the back side, and it can be used in scenarios such as head-mounted displays and micro-projectors.

Another aspect of the present disclosure provides an LCoS panel. The LCoS panel includes a wafer substrate. The wafer substrate includes a silicon substrate including a first surface and a second surface opposite to the first surface. The first surface includes an active circuit, the active circuit includes a pixel circuit area and a peripheral circuit area, the second surface includes a plurality of conductive interfaces, and a thickness of the silicon substrate ranges from 220 µm to 500 µm. The wafer substrate further includes a plurality of vias extending through the first surface and the second surface. Each of the plurality of conductive interfaces is arranged to correspond to one of the plurality of vias, and is electrically connected to the active circuit by a corresponding via. The LCoS panel further includes a transparent substrate including a transparent conductive layer. The transparent substrate is opposite to the wafer substrate. The LCoS panel further includes a seal between the wafer substrate and the transparent substrate. The seal surrounds the pixel circuit area of the active circuit and defines a liquid crystal space. The LCoS panel further includes a liquid crystal injected in the liquid crystal space. The plurality of conductive interfaces electrically connects the LCoS panel to an external circuit substrate.

The flow of current of the LCoS panel of the structure is perpendicular to the panel direction, which can allow an increased thinness. Generally, the LCoS panel of the structure has only a three-layer structure of a transparent substrate layer, a liquid crystal layer, and a wafer substrate layer. There is no need to set up redundant metal plates and heat sinks on the back side, and it can be used in scenarios such as head-mounted displays and micro-projectors.

The following specific embodiments will further illustrate the present disclosure in conjunction with the above drawings.

DESCRIPTION OF EMBODIMENTS

In the following, the technical solutions of the embodiments of the present disclosure will be clearly and completely described in conjunction with the accompanying drawings of the embodiments of the present invention. Obviously, the described embodiments are only a part of embodiments, but not all embodiments. Unless otherwise defined, all technical and scientific terms used herein have the same meaning as commonly understood by those skilled in the technical field of the present disclosure. The terms used in the description of the present disclosure herein are only for the purpose of describing specific embodiments, and are not intended to limit the present disclosure.

In the present disclosure, a die refers to a part of the LCoS panel that does not include a liquid crystal packaging structure (liquid crystal, transparent substrate, seal, etc.), and mainly includes the wafer substrate (silicon substrate and active circuit, etc.) and a circuit packaging structure (vias and conductive interfaces, etc.). An LCoS panel includes a die and a liquid crystal packaging structure, and can be independent product. An LCoS module includes an LCoS panel and an external circuit substrate, which can be obtained by combining the LCoS panel with a PCB board by a downstream manufacturing process, and can also be assembled and sold with an external circuit substrate after the LCoS panel is produced. The functional integrity of the LCoS panel is not limited by the external circuit substrate.

Figure 1:
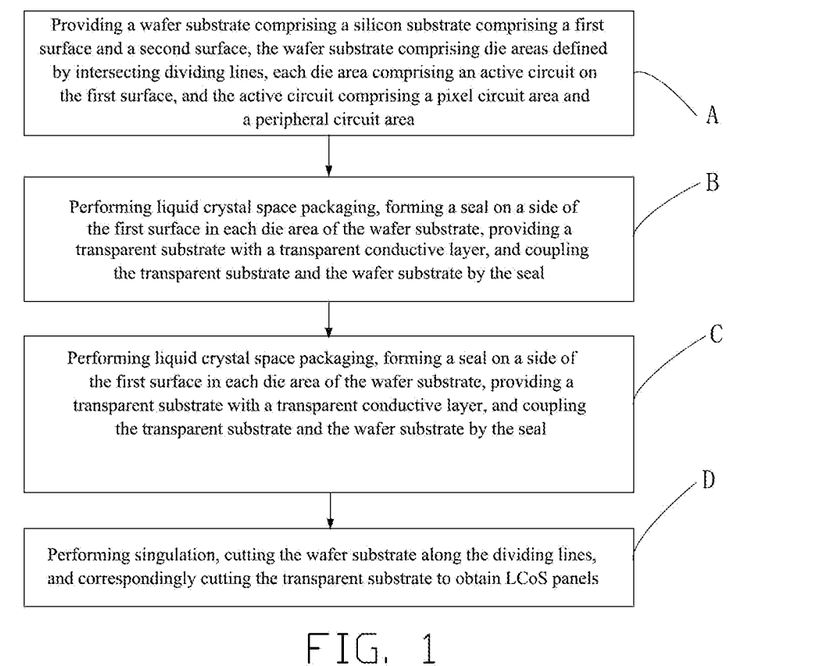
FIG. 1 is a flowchart of a preparation method of an LCoS panel according to a first embodiment of the present disclosure.

FIG. 1 is a flowchart of a preparation method of an LCoS panel according to an embodiment of the present disclosure. As shown in FIG. 1, the preparation method of the LCoS panel includes the following steps.

In step A, a wafer substrate is provided. The wafer substrate includes a silicon substrate with a first surface and a second surface opposite to the first surface. The wafer substrate includes a plurality of die areas defined by a plurality of intersecting dividing lines. Each die area includes an active circuit on the first surface. The active circuit at least includes a pixel circuit area and a peripheral circuit area.

In step B, liquid crystal space packaging is performed. A seal is formed on a side of the first surface in each die area of the wafer substrate. The seal at least surrounds the pixel circuit area of the active circuit. The seal defines a liquid crystal space of the die area where the seal is located. A transparent substrate including a transparent conductive layer is provided, and a surface of the transparent substrate including a transparent conductive layer is coupled with the wafer substrate by the seal.

In step C, circuit packaging is performed. The silicon substrate is thinned to a first thickness. The first thickness ranges from 220 µm to 500 µm. A plurality of vias extending through the first surface and the second surface are manufactured in each die area of the wafer substrate, and a plurality of conductive interfaces are manufactured on the second surface. Each conductive interface is arranged to correspond to one via, and each conductive interface is electrically connected to the active circuit of one die area where the conductive interface is located by a corresponding one via. The phrase "extending through" of the present disclosure refers to the penetration of the silicon substrate, no penetration of the whole wafer substrate. There is an active circuit layer where the active circuits are located on the first surface of the silicon substrate. The vias are connected to the active circuit instead of penetrating the active circuit.

In step D, singulation is performed. The wafer substrate is cut along the dividing lines, and the transparent substrate is correspondingly cut to obtain a plurality of LCoS panels.

When the LCoS panels obtained by the preparation method of the present disclosure is applied to a product, the method further includes a step of mounting the LCoS panels, so that each LCoS panel is electrically connected to an external circuit substrate to obtain a plurality of LCoS modules. The step of mounting the LCoS panels does not count as a necessary step in the preparation method of the LCoS panel.

The preparation method of the LCoS panel is illustrated below in combination with the drawings.

In Step A, a wafer substrate is provided.

In the present disclosure, the diameter of the wafer substrate is, for example, 8 inches (200 mm) or 12 inches (300 mm). The wafer substrate provided can be obtained by integrated circuit manufacturing before or in step A. The integrated circuit manufacturing process can be carried out in a foundry (typically such as TSMC, Samsung, UMC, GlobalFoundries, SMIC, etc.).

Figure 3:
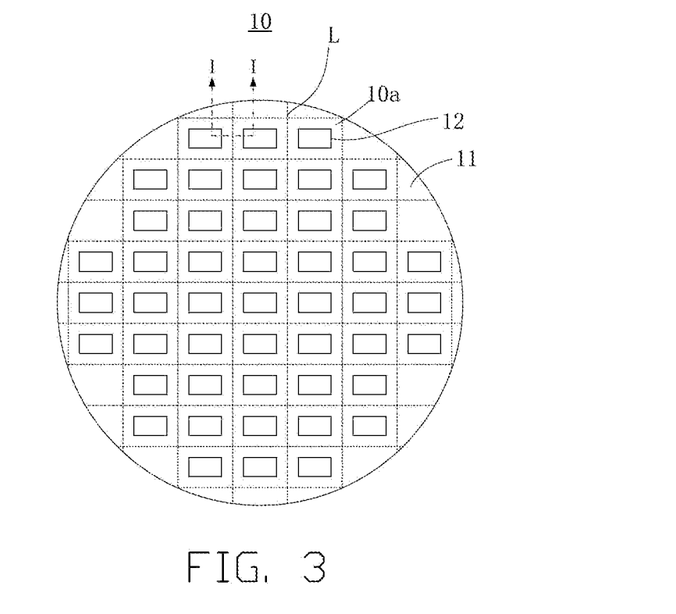
FIG. 3 is a top view of the wafer substrate provided in step A of the method in FIG. 1.

As shown in FIG. 3, the wafer substrate 10 includes a silicon substrate 11, and the wafer substrate 10 includes a plurality of die areas 10a defined by a plurality of intersecting dividing lines L. The dividing lines L are represented by a dotted line in drawings, and the dividing lines L can be either actual scribe lines or virtual lines. Each die area includes an active circuit 12. The active circuit 12 at least includes a pixel circuit area (mainly including pixel storage circuits for controlling liquid crystal) and a peripheral circuit area (mainly including logic circuits, timing control circuits, buffer circuits, signal conversion circuits, etc.).

Figure 4:
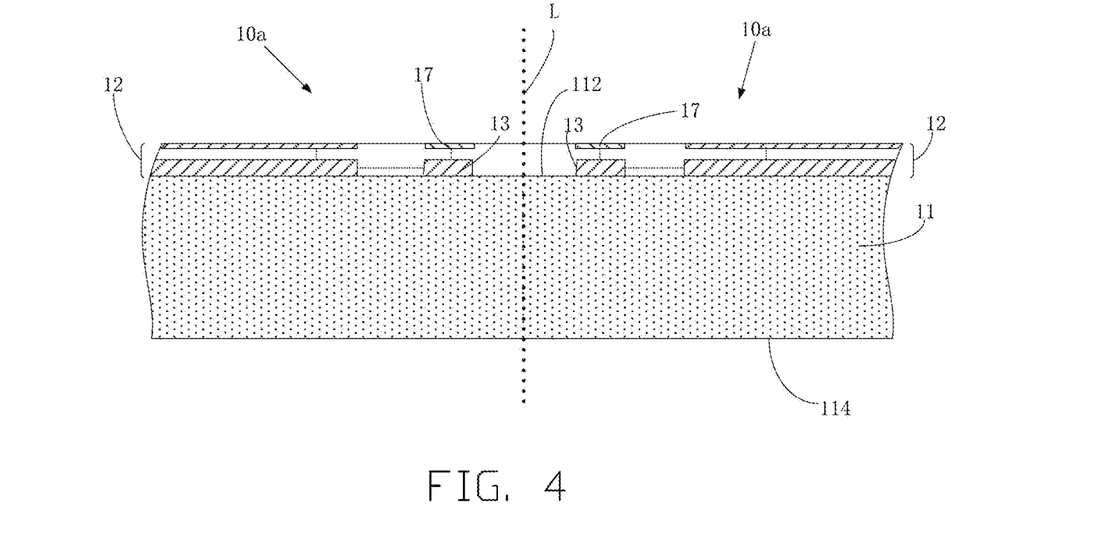
FIG. 4 is a cross-sectional along line I-I of FIG. 3.

Specifically, as shown in FIG. 4, the silicon substrate 11 has a first surface 112 and a second surface 114 opposite to each other. The first surface 112 may also be referred to as a front surface of the silicon substrate, and the second surface 114 may also be referred to as a back surface of the silicon substrate. The thickness range of the silicon substrate shipped in usually ranges from 800 µm to 1000 µm. A material of the silicon substrate 11 is, for example, monocrystalline silicon, polycrystalline silicon, silicon germanium, silicon carbide, and the like.

The active circuit 12 is arranged on the first surface 112. The active circuit 12 specifically includes an active-matrix display circuit including a plurality of metal oxide semiconductor (MOS) transistors (not shown) and a plurality of reflective electrodes (not shown). The reflective electrodes are located in the outermost layer of the active circuit 12. That is, the reflective electrodes are located at the furthest position from the first surface 112. The reflective electrodes reflect light of the LCoS panel, and usually include a reflective aluminum film. The active circuit 12 includes a plurality of metal layers. In the embodiment shown in FIG. 4, only two metal layers (the part filled with a diagonal "/" in FIG. 4) are shown. It is understood that in other embodiments of the present disclosure, the active circuit may have more metal layers. The plurality of metal layers can be stacked in a direction perpendicular to the silicon substrate 11, a dielectric layer (such as silicon glass) is arranged between different metal layers, and a dielectric layer (not shown) is also arranged between the metal layers and the silicon substrate 11. The metal layers can be electrically connected to each other by vias. The active circuit 12 includes a plurality of input/output terminals 13. As ports of each functional circuit, the input/output terminals 13 can be regarded as a part of the active circuit 12, which is etched at the same time during the manufacture of the integrated circuit. The active circuit 12 is connected to external circuit structure through the input/output terminals 13. The input/output terminals 13 of each metal layer can be etched at the same time when the functional circuit of each metal layer of the active circuit 12 is manufactured. In the present disclosure, the number of input/output terminals 13 in each die area 10a is not limited.

As shown in FIG. 4, in the present embodiment, the wafer substrate 10 further includes a plurality of conductive pads 17 spaced apart from each other on a side of the first surface. The conductive pads 17 are electrically connected to the active circuit 12. The conductive pads 17 may also be regarded as a portion of the active circuit 12. Accordingly, in the manufacturing process, when the wafer substrate 10 is provided in step A, the conductive pads 17 spaced apart from each other are formed in each die area 10a on the first surface 112. The conductive pads 17 can be manufactured at the same time as the metal layer where the reflective electrodes are located. The conductive pads 17 can be used to test the active circuit 12 in the subsequent preparation process (such as before and after liquid crystal space packaging, before and after circuit packaging), and the test can be carried out from the front side of the wafer substrate (a side of the first surface), so the operation is convenient.

Specifically, the application and structure of the conductive pads 17 will be described in detail in the subsequent embodiments of the LCoS panel, and not repeated here. It is understood that in some embodiments of the present disclosure, the conductive pads 17 are not included in the manufacture.

Between step A and step B, a step of cleaning the wafer substrate 10 is further included, which may include steps such as deionized water cleaning, plasma cleaning, and the like. After the cleaning step, the step of forming an alignment layer on the wafer substrate 10 is further included. The alignment layer is used to give an initial orientation to liquid crystal molecules, so that the liquid crystal molecules at different positions have the same orientation in the non-working state. A material of the alignment layer can be, for example, silicon oxide (SiOx), which is prepared by electron beam evaporation. Alternatively, the material of the alignment layer can be, for example, polyimide, and its preparation includes first forming a coating by spraying, chemical vapor deposition or atomic layer deposition, and then forming several orientation grooves on a surface of the alignment material coating by a rubbing process or a laser processing process to obtain an alignment layer with alignment ability. Since the upper and lower surfaces of liquid crystal layer require alignment layers, the alignment layer below the liquid crystal layer (that is, close to the wafer substrate 10)

is defined as a first alignment layer, and the alignment layer above the liquid crystal layer (that is, close to the transparent substrate) is defined as a second alignment layer. Since two transparent substrates of a liquid crystal panel (LCD) including thin film transistors (TFTs) also need alignment films to orient the liquid crystal molecules. In one embodiment, the step of cleaning the wafer substrate 10 can be carried out on a conventional LCD production line.

Figure 5:
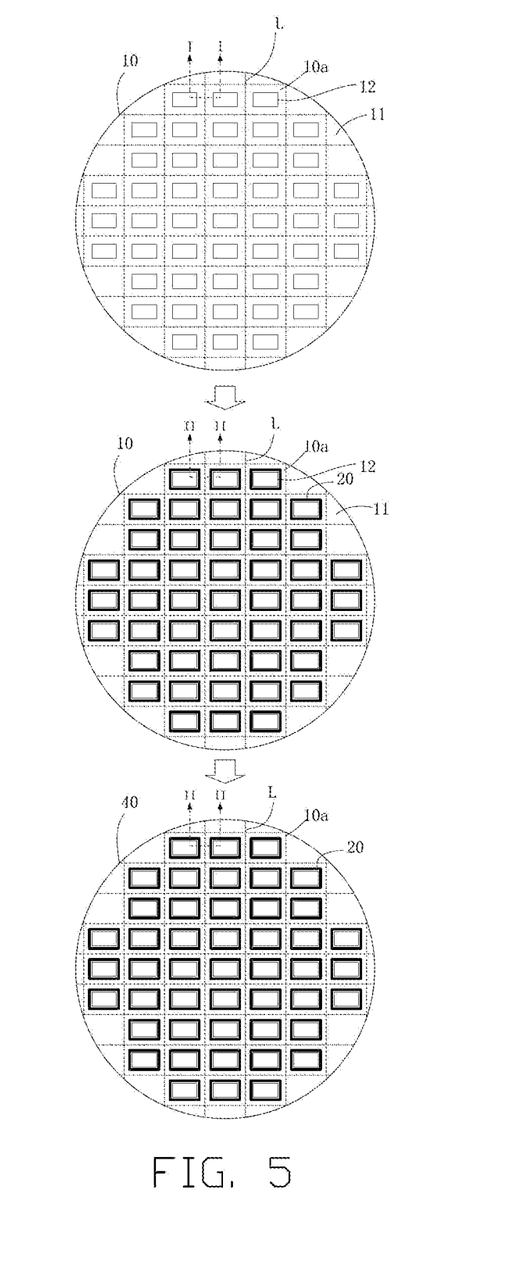
FIG. 5 is a top view of each specific process showing step B of the method in FIG. 1.
Figure 6:
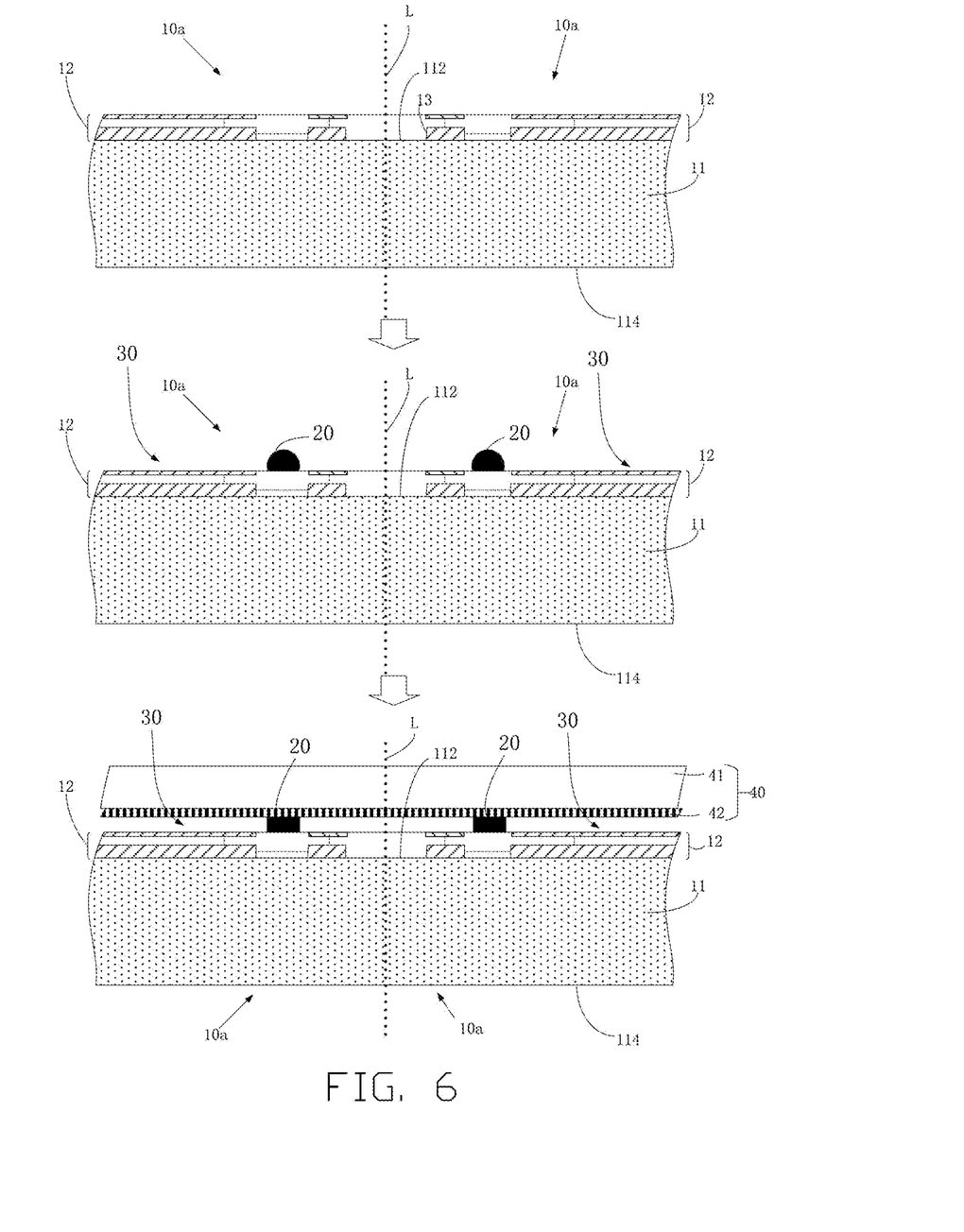
FIG. 6 is a cross-section along line II-II of FIG. 5.

In step B, liquid crystal space packaging is performed. A liquid crystal space is formed in each die area on the wafer substrate via a seal and the transparent substrate. Referring to FIG. 5 and FIG. 6, a seal 20 is arranged on a side of the first surface 112 in each wafer die area 10a of the wafer substrate 10. The seal 20 at least surrounds the pixel circuit area of the active circuit 12. A transparent substrate 40 is provided, and the transparent substrate 40 and the wafer substrate 10 are coupled by means of the seal 20.

In one embodiment, the seal 20 may be set by screen printing or dispensing. The seal 20 defines a liquid crystal space 30 of the die area 10a where the seal 20 is located. The transparent substrate 40 includes a transparent base layer 41 and a transparent conductive layer 42. A material of the transparent base layer 41 is, for example, glass. A material of the transparent conductive layer 42 is, for example, indium tin oxide (ITO), fluorine-doped tin oxide (SnO2: F, FTO), aluminum-doped zinc oxide (ZnO: Al, AZO), or other oxide including at least one element of indium, antimony, zinc and cadmium. A surface of the transparent substrate 40 with the transparent conductive layer 42 is coupled with the wafer substrate 10 by the seal 20.

In the embodiment shown in FIG. 5 and FIG. 6, the seal 20 formed in each die area 10a has an annular structure. The annular structure combines the wafer substrate 10 and the transparent substrate 40 to form an enclosed space (or only a small-sized liquid crystal injecting port is retained), which can be used to seal liquid crystal into the liquid crystal space 30. The seal 20 at least surrounds the pixel circuit area of the active circuit, so that the light emitted by the pixels of the LCoS panel can be emitted within the range framed by the seal 20. Alternatively, the peripheral circuit area of the active circuit may also be located below the seal 20. In the present disclosure, for each die area 10a, a width of the seal 20 is in a range of 400 µm to 1000 µm.

A material of the seal 20 can be thermal curing adhesive and/or ultraviolet curing adhesive, and so on. In an embodiment, both light curing and thermal curing are used. Thermal curing is used to compensate the curing of the seal 20 which is not irradiated by ultraviolet light, so as to avoid the problem of insufficient curing of the seal 20. The seal 20 may be mixed with rigid microspheres or other spacers (such as plastic, silicon oxide, glass, resin or other mixtures of similar properties) to maintain a suitable thickness of the seal 20 when pressed. In addition, the seal 20 not only adheres the wafer substrate 10 and the glass substrate 40, but also plays a role in resisting the intrusion of external contaminants such as water vapor.

The step of attaching the transparent substrate 40 specifically includes, in a vacuum state, the transparent substrate 40 being coupled with the wafer substrate 10 by a laminator, and then the seal 20 is cured.

In the present disclosure, in order to initially orient the liquid crystal in the liquid crystal space 30, it is also necessary to provide an alignment layer (not shown) on the upper and lower sides of the liquid crystal. Specifically, it includes a first alignment layer on a side of the wafer substrate 10 and a second alignment layer on a side of the transparent substrate 40. The preparation of the first alignment layer has been described above. Regarding the preparation of the second alignment layer, refer to the preparation of the first alignment layer, which includes providing a transparent substrate 40 with a size equivalent to the wafer substrate 10, cleaning the transparent substrate (for example, cleaning with deionized water followed by plasma cleaning), forming an alignment material coating on the transparent conductive layer 42 of the transparent substrate 40 by evaporation, coating or deposition, and then forming several orientation grooves on a surface of the alignment material coating by a rubbing process to obtain the second alignment layer. The second alignment layer is located on the surface of the transparent conductive layer 42. The thickness of the transparent substrate 40 in the present disclosure can be selected from 200 µm to 750 µm, a thinner transparent substrate can be obtained by a grinding process.

Figure 7A:
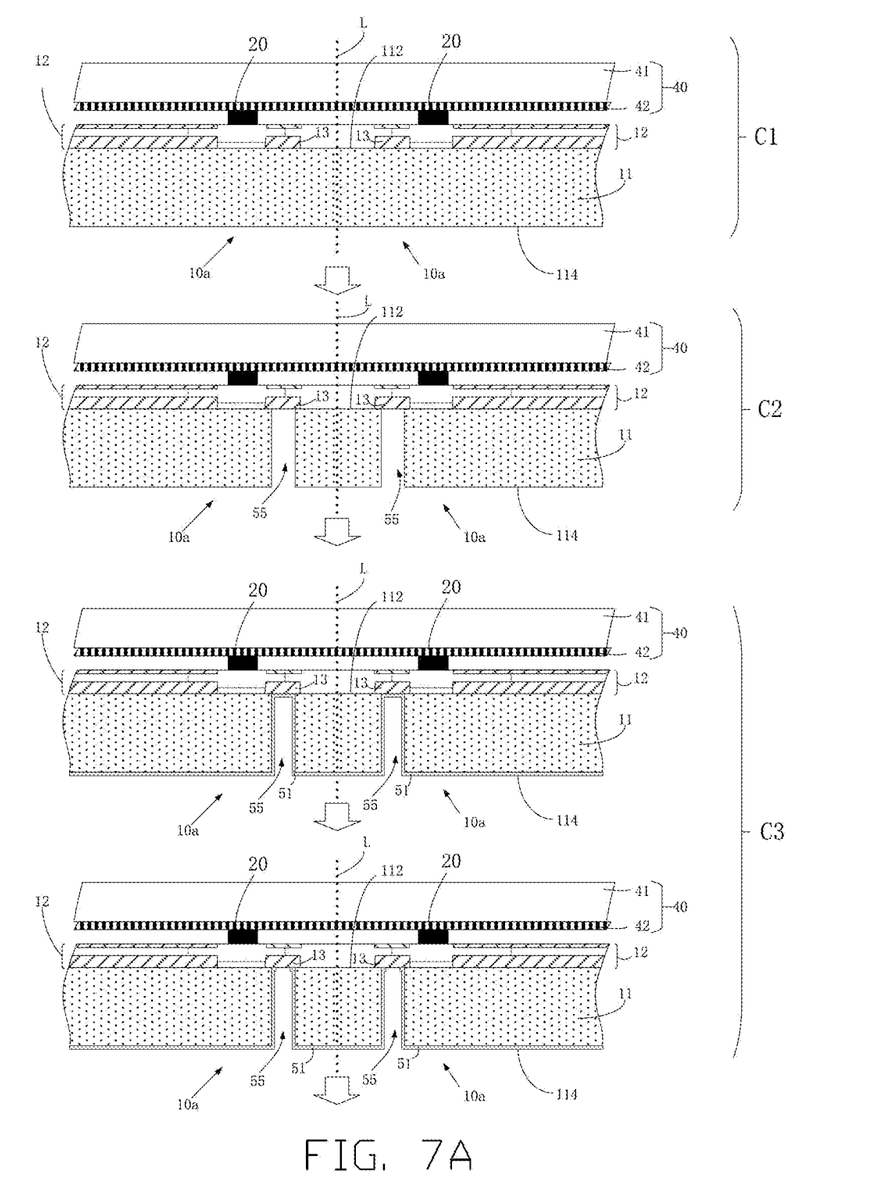
FIG. 7A is a partial cross-sectional view showing specific processes C1, C2, and C3 of step C in the method in FIG. 1.
Figure 7B:
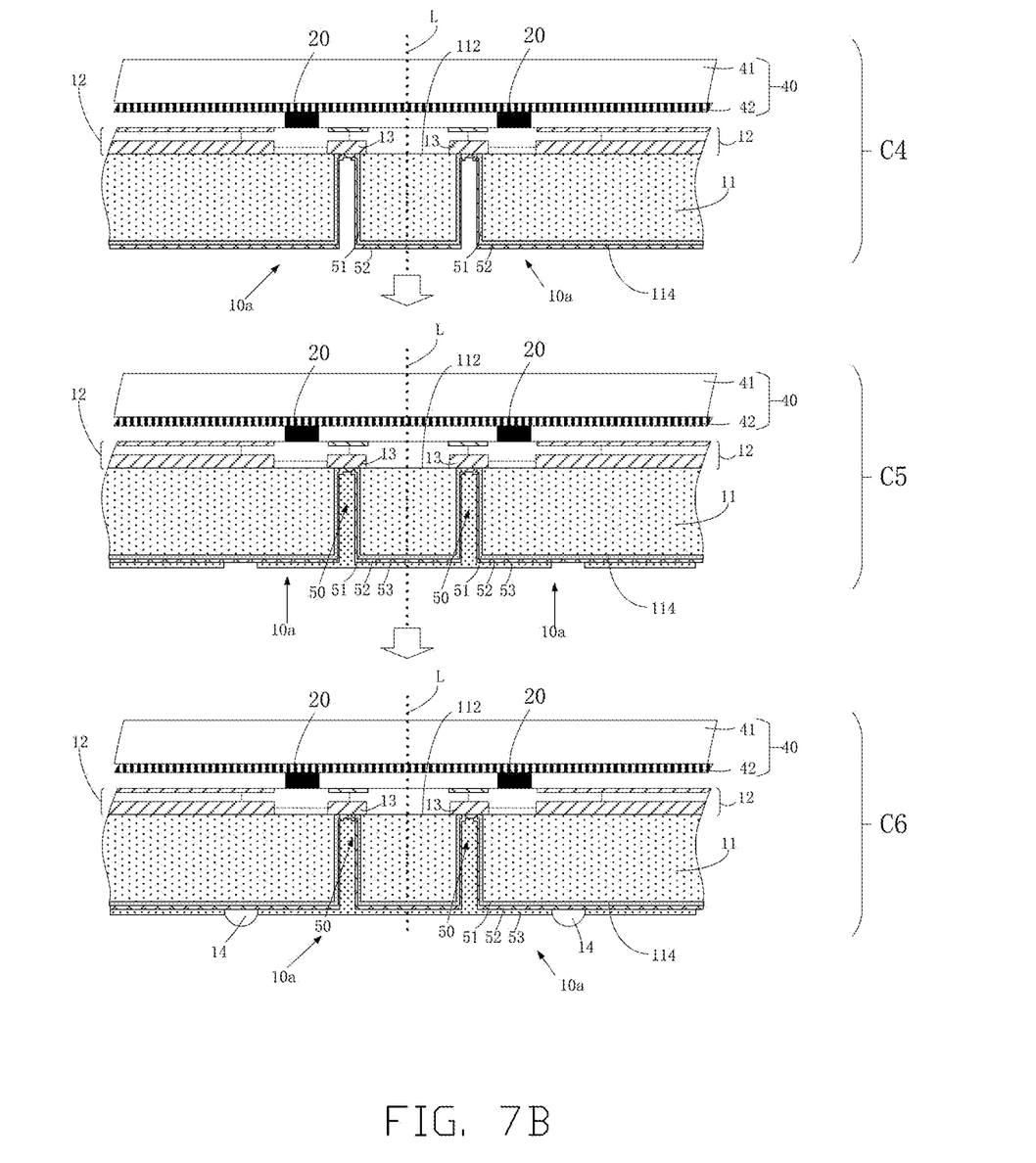
FIG. 7B is a partial sectional view showing specific processes C4, C5 and C6 of step C in the method in FIG. 1.

In Step C, circuit packaging is performed. The silicon substrate 11 is thinned to a first thickness, and vias and conductive interfaces are manufactured in each die area of the wafer substrate. As shown in FIG. 7A and FIG. 7B, on the wafer substrate obtained in step B, after the silicon substrate is thinned, a plurality of vias 50 (metallized holes) extending through the first surface and the second surface are manufactured in each die area 10a. A plurality of conductive interfaces 14 are manufactured on the second surface, and each conductive interface 14 corresponds to one via 50. Each conductive interface 14 is electrically connected to an active circuit 12 of the die area 10a where the conductive interface 14 is located by a corresponding via 50.

Specifically, step C includes steps C1, C2, C3, C4, C5, and C6, which are illustrated as follows.

In step C1, the silicon substrate 11 is thinned to the first thickness, and the first thickness ranges from 220 µm to 500 µm. The thinning of silicon substrate 11 can be achieved by grinding, chemical mechanical polishing, wet etching, and the like. The thinned silicon substrate is easier to perforate, and the overall thickness of the LCoS panel can be reduced. However, excessive thinness will cause the mechanical properties of the silicon substrate 11 to decrease, which may cause the silicon substrate to crack during the drilling process or adversely effect on the active circuit 12. Moreover, an excessively thin thickness will work against the optical flatness of the silicon substrate 11, and is likely to be slightly bent. The slight bending may cause a large distance offset or deformation of the image of the reflected light at a far position. Therefore, the present disclosure chooses to manufacture vias on a thicker silicon substrate, which can not only ensure the product yield, but also improve the optical flatness of the LCoS panel.

In one embodiment of the present disclosure, preferably, the first thickness ranges from 300 µm to 400 µm.

In step C2, a plurality of through holes 55 extending through the first surface 112 and the second surface 114 is manufactured from the second surface 114 of the silicon substrate 11 to expose the input/output terminals 13. Since the thickness of the silicon substrate 11 of the present disclosure is relatively large, optionally, the present embodiment first uses laser drilling to form blind holes on the silicon substrate 11, and then performs reactive ion etching at the blind holes, so that the input/output terminals 13 of the active circuit 12 are exposed. In the present embodiment, laser drilling is combined with reactive ion etching. On the one hand, laser drilling is used to form holes with large depth to width ratio, and on the other hand, the combination of laser drilling and reactive ion etching prevents laser drilling from damaging the input/output terminal 13.

In the present disclosure, the range of the depth to width ratio of each via ranges from 5:1 to 10:1.

For each of the die areas, a projection of the manufactured through holes 55 on the wafer substrate 10 does not intercept and surrounds the pixel circuit area, so that the projection of the vias on the wafer substrate 10 does not intercept and surrounds the pixel circuit area.

Figure 8:
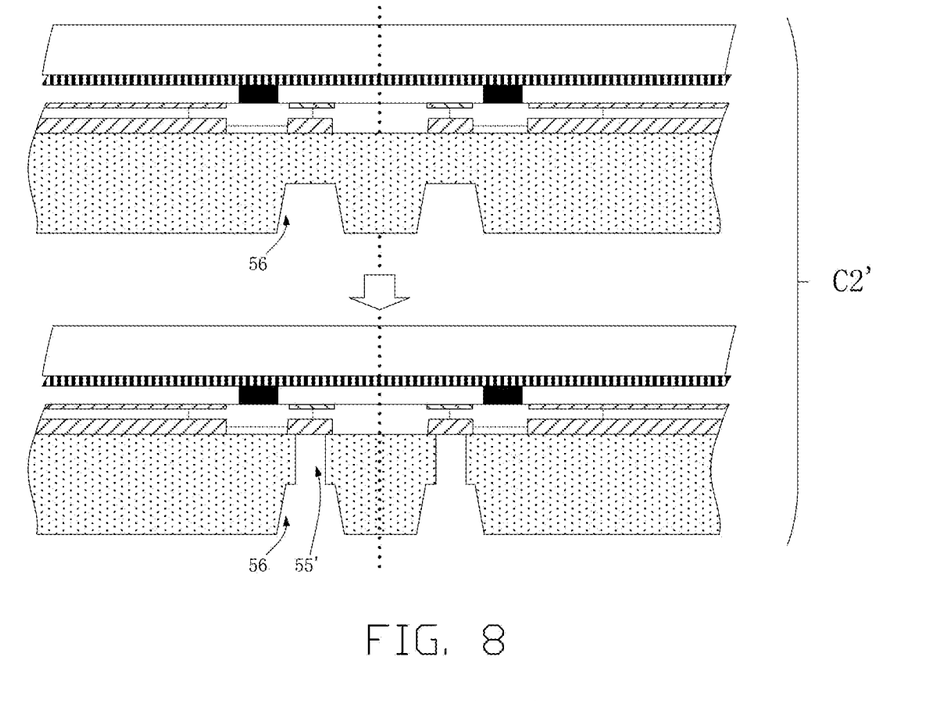
FIG. 8 is a partial cross-sectional view showing a modified step C2' of step C2 of FIG. 7A.

Since the LCoS panel of some embodiments of the present disclosure contains a large number of vias, dozens of vias, when manufacturing the vias, a plurality of grooves can be formed on the second surface of the silicon substrate, and then a plurality of vias is formed in the grooves. On the one hand, a large thickness of the silicon substrate can be maintained, and on the other hand, a depth of drilling required while manufacturing a single via is reduced, a process difficulty is reduced, and a production efficiency is improved. Specifically, referring to FIG. 8, the grooves 56 are formed on the second surface of the silicon substrate, and then a plurality of through holes 55' is formed in the grooves 56, and vias are formed. In the present embodiment, due to the presence of the groove 56, the depth to width ratio of a portion of the through hole 55' of the via may be small, such as 5:1 to 7:1. For the embodiments without grooves, the depth of the through hole is relatively large, and the range of the depth to width ratio of each via is preferably from 8:1 to 10:1.

In step C3, a dielectric layer 51 covering inner walls of the through holes 55 and some part of the second surface 114 is manufactured, the dielectric layer 51 is etched to ensure that the input/output terminals 13 are exposed, and a patterned dielectric layer 51 is obtained.

In step C4, a patterned conductive layer 52 covering at least part of the patterned dielectric layer 51 is manufactured, and the patterned conductive layer 52 covers the input/output terminals 13 from the second surface 114 and is electrically connected to the input/output terminals 13. Some part of the patterned conductive layer 52 extends to the second surface 114. A material of the patterned conductive layer 52 is, for example, copper, or other metals or metal alloys. In step C4, manufacturing the patterned conductive layer 52 may specifically include depositing a metal conductive layer, and then patterning and etching, or it may be directly deposited in a patterned manner.

In step C5, a pattern passivation layer 53 covering some part of the patterned conductive layer 52 is manufactured from the second surface 114 of the silicon substrate 11. The patterned passivation layer 53 is used for insulating the patterned conductive layer 52 to prevent the patterned conductive layer 52 from being short-circuited by an external device. Specifically, the pattern passivation layer 53 may include a dielectric material, such as polyimide (PI) or epoxy.

In step C6, a plurality of conductive interfaces 14 is manufactured in an area where the patterned conductive layer 52 is not covered by the pattern passivation layer 53. Each via 50 at least includes the patterned dielectric layer 51, the patterned conductive layer 52, and the patterned passivation layer 53 in the through hole 55, and extends to the second surface 114 and is electrically connected with the conductive interfaces 14 by the patterned conductive layer 52. Each via 50 is vertically connected with a different input/output terminal 13 of the metal layer of the active circuit 12, thereby realizing electrical connection between the active circuit 12 and the via 50.

The conductive interface s 14 include at least one of a ball grid array (BGA) package structure, a pin grid array (PGA) structure, and a grid array (LGA) package structure. A material of the first conductive interfaces is, for example, selected from a group consisting of tin, tin-silver, tin-lead, tin-silver-copper, tin-silver-zinc, tin-zinc, tin-bismuth-indium, tin-indium, tin-gold, tin-copper, tin-zinc-indium, and tin-silver-antimony, and the material of the conductive interface 14 may include an active agent. The above types of packaging structure can enable the LCoS panel to be connected to an external circuit substrate in a vertical direction.

Figure 9:
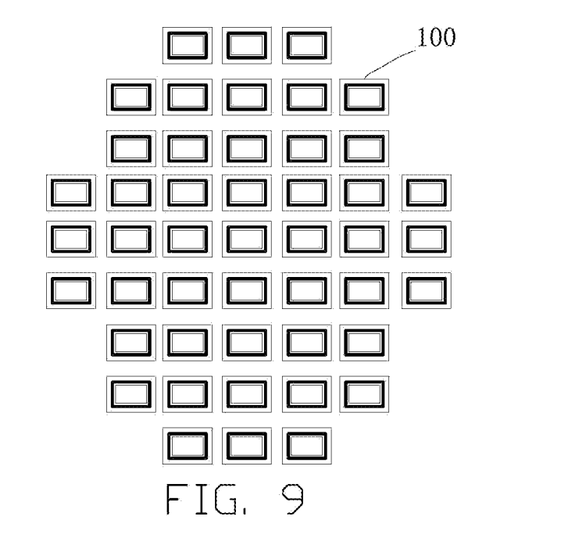
FIG. 9 is a schematic view showing step D of the method in FIG. 1.

In step D, singulation is performed. A plurality of LCoS panels is obtained by cutting the transparent substrate and the wafer substrate.

As shown in FIG. 9, in step D, the transparent substrate and the wafer substrate are cut along the dividing lines to obtain a plurality of LCoS panels 100.

Specifically, a direct cutting method can be used to directly cut the silicon substrate and transparent substrate by a cutting equipment, including physical cutting and laser cutting. Alternatively, a method of sawing grooves first (incomplete cutting) or scribing, and then physically breaking can be used.

In the present embodiment, the lines for cutting of the wafer substrate and the transparent substrate coincide in a direction perpendicular to the wafer substrate, instead of the misalignment relationship in the traditional process, so that the cut transparent substrate does not protrude relative to the wafer substrate; there is no need for the transparent substrate to expose the front side (the first surface of the silicon substrate) of the wafer substrate.

In order to protect the conductive interfaces 14 and other structures on the back side of the wafer substrate 10, a carrier can be designed for placing the wafer substrate 10. The carrier has grooves corresponding to the conductive interfaces 14, which can protect the structures on the back side of the wafer substrate 10 from being crushed on the one hand, and facilitate dicing and cutting on the other hand.

In step D of the first embodiment, after the wafer substrate 10 and the transparent substrate 40 are cut, the step of injecting liquid crystal into the liquid crystal space is further included. Specifically, it can be realized by vacuum siphoning. After the liquid crystal is filled, the liquid crystal injecting port reserved by the seal is blocked to seal in the liquid crystal.

This technical solution is an economical and feasible technical route combined with actual production. Under this technical solution, although the liquid crystal filling is at die level, 90% of the overall production process of the LCoS panels is at wafer level, especially the circuit packaging (step C) is at wafer level, which still meets the advantage of large-scale mass production.

In the present disclosure, the total thickness range of each obtained LCoS panel ranges from 400 μm to 1300 μm, which mainly includes the thickness of the transparent substrate layer, the liquid crystal, and the wafer substrate layer. In terms of size, the size after cutting is the size of the LCoS panel 100, which is the same as the die size. That is, the packaging process of the present disclosure is chip scale package (CSP). The reduction of the overall size of the LCoS panel 100 makes it more suitable for use in the field of head-mounted display and micro-projection.

After the LCoS panel 100 is prepared by steps A to D, the LCoS panel 100 can be directly shipped as a product. Downstream customers can install the LCoS panel 100 on an external circuit substrate (such as a PCB board), thereby installing the LCoS panel 100 into a system. Specifically, the external circuit substrate may include a plurality of modules, such as an FPGA module, a power supply module, a display chip module, and so on. The LCoS panel 100 prepared by the present disclosure can be installed in a slot of the display chip module or welded to the display chip module.

Figure 10:
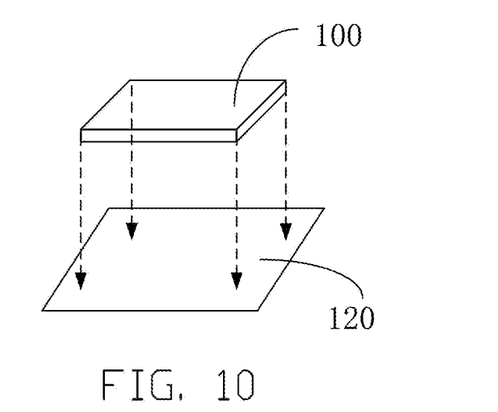
FIG. 10 is a schematic view showing an LCoS panel mounted on an external circuit substrate.

FIG. 10 shows one LCoS panel 100 electrically connected to one external circuit substrate 120. The external circuit substrate 120 may be a soft circuit board or a printed circuit board. The LCoS panel 100 is electrically connected with the external circuit substrate 120 by the conductive interfaces 14, so that the active circuit 12 is electrically connected to the external circuit substrate 120 by the plurality of input/output terminals 13, the plurality of vias 50, and the plurality of conductive interfaces 14 to input and output signals. Specifically, the LCoS module 100 defines a plurality of pixels (not shown), and the active-matrix display circuit is provided with a group of MOS transistors corresponding to each pixel. Each group of MOS transistors in the active-matrix display circuit can control the electric field of the liquid crystal molecules corresponding to each pixel by controlling a voltage applied to the reflective electrodes, so as to adjust a rotation angle of the liquid crystal molecules corresponding to each pixel, and further control a polarization state of the outgoing light in the corresponding area of each pixel, and cooperate with a polarization beam splitter to realize image modulation.

Figure 11:
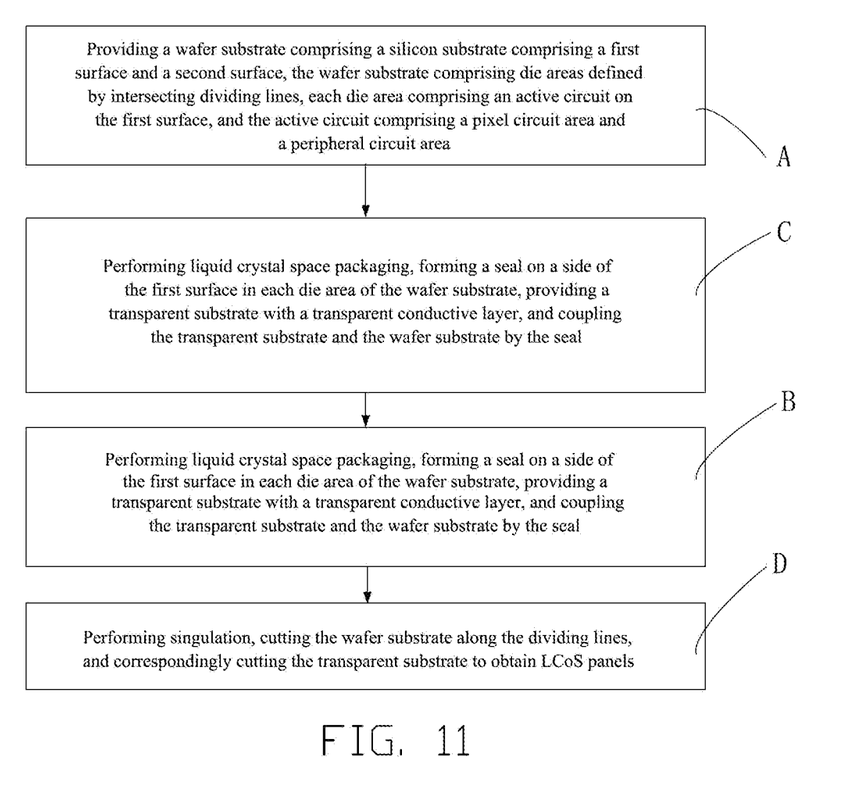
FIG. 11 is a flowchart of a preparation method of an LCoS panel provided by a second embodiment of the present disclosure.
Figure 12:
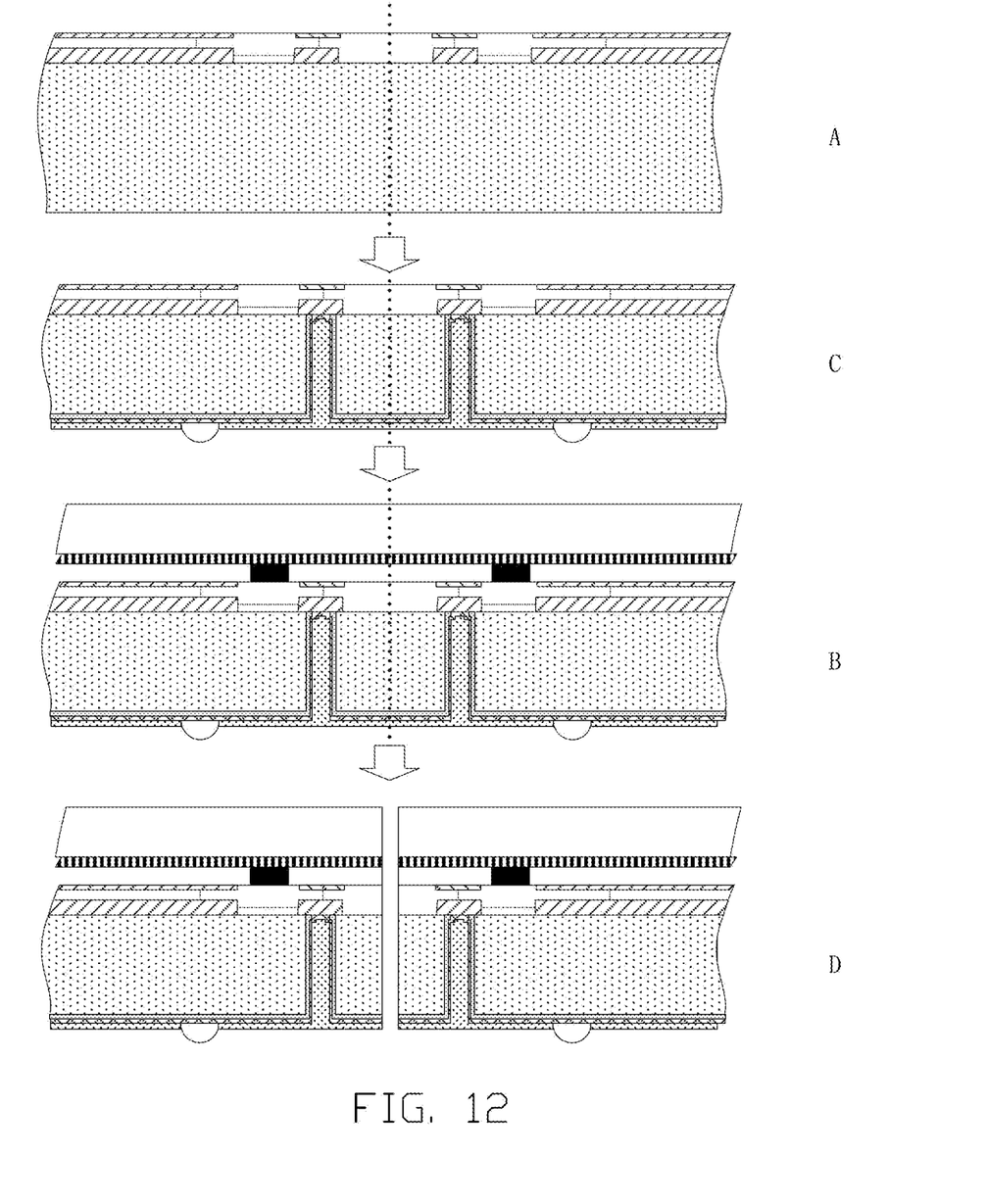
FIG. 12 is a schematic view showing method steps in FIG. 11.

The above first embodiment and various specific modified embodiments provide a preparation method of an LCoS panel. Under the same concept of the present disclosure, there is another modified embodiment (i.e., a second embodiment) of the preparation method of an LCoS panel. The difference between the technical solution of the second embodiment and the above embodiments is that the order of step B and step C is exchanged. As shown in FIG. 11 and FIG. 12, in the second embodiment, the circuit packaging is performed first, and then the liquid crystal space packaging is performed.

For each step of the second embodiment and the structure in each step, refer to the description and drawings corresponding to the first embodiment. Since the liquid crystal space packaging process of step B and the circuit packaging process of step C are relatively independent and have little influence on each other, the order can be exchanged. There are pros and cons to B as first step and then step C instead of step C first and then step B. Specifically, for first step B then step C, the formed liquid crystal space can be used to protect the pixel circuit area of the active circuit. Performing C first then step B can prevent the pollution (such as organic matter volatilization) produced by the seal in step B from affecting the equipment of step C, especially, if the equipment is not dedicated to the preparation and production of this application, then cross-contamination may occur in the preparation of other products.

In the first and second embodiments, the process of injecting liquid crystal is performed after cutting the wafer substrate and the transparent substrate in step D. In other embodiments of the present disclosure, regardless of the order of step B and step C, liquid crystal may be injected in step B. In step B, after the seal is formed and before the transparent substrate is attached, the step of injecting liquid crystal into the liquid crystal space is further included. Specifically, the liquid crystal is injected by a one drop filling (ODF) process. The ODF process can be carried out before lamination of the transparent substrate, which can significantly reduce the filling time of liquid crystal, and improve a utilization rate of the liquid crystal. Moreover, the ODF process can be carried out at wafer level, making the whole preparation method of LCoS panel at wafer level, significantly improving mass production. However, there are also difficulties such as expensive ODF equipment and the need for liquid crystal droplet preparation technology.

Figure 2:
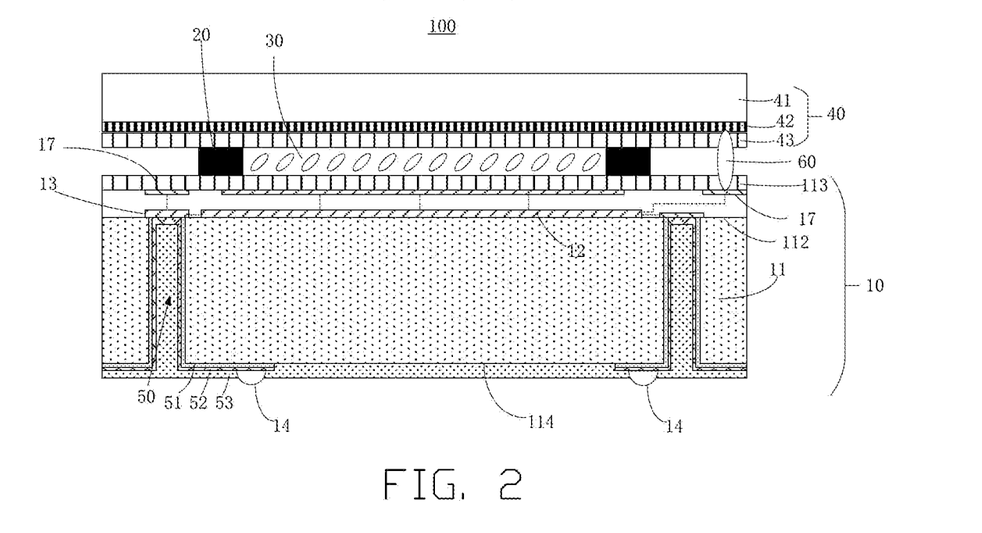
FIG. 2 is a cross-sectional view of the LCoS panel according to an embodiment of the present disclosure.

An embodiment of the present disclosure further provides an LCoS panel, and an LCoS module obtained by the preparation method of the LCoS panel. The LCoS module includes an LCoS panel, and an external circuit substrate electrically connected to the LCoS panel. The LCoS panel is electrically connected to the external circuit substrate by the conductive interfaces. As shown in FIG. 2, the LCoS panel 100 includes a wafer substrate 10 and a transparent substrate 40 opposite to the wafer substrate 10.

The wafer substrate 10 includes a silicon substrate 11 having a first surface 112 and a second surface 114 opposed to each other. The wafer substrate 10 further includes an active circuit 12 on the first surface 112, a plurality of conductive interfaces 14 on the second surface 114, and a plurality of vias 50 extending through the first surface 112 and the second surface 114. Each conductive interface 14 is arranged to correspond to one via 50, and each conductive interface 14 is electrically connected to the active circuit 12 by one corresponding via 50. The active circuit includes a pixel circuit area and a peripheral circuit area.

Specifically, the pixel circuit area includes a plurality of pixel circuits, each pixel circuit corresponds one of the liquid crystal pixels of the LCoS panel. The pixel circuits control the deflection of the liquid crystal molecules by controlling the electric field where the liquid crystal molecules of the liquid crystal pixels are located. The peripheral circuit area is connected to the pixel circuit area by circuits to process input image signals, power signals, and other control signals, thereby outputting control signals of the pixel circuits to the pixel circuit area.

In the present disclosure, a thickness of the silicon substrate 11 ranges from 220 μm to 500 μm. This thickness takes into account both mechanical reliability and optical flatness, and is also beneficial to reduce the damage that may be caused to the active circuit 12 and the silicon substrate 11 during the manufacture of the vias 50. Further, the range of the thickness is preferably from 300 μm to 400 μm.

The transparent substrate 40 includes a transparent base layer 41 and a transparent conductive layer 42, and the transparent conductive layer 42 is disposed opposite to the wafer substrate 10. The wafer substrate 10 and the transparent substrate 40 are connected by a seal 20 disposed therebetween. The seal 20 at least surrounds the pixel circuit area of the active circuit 12 and defines a liquid crystal space 30. That is, the seal 20, the wafer substrate 10, and the transparent substrate 40 are enclosed to form a closed space for injecting liquid crystal and forming a liquid crystal layer. A thickness of the transparent substrate 40 ranges from 200 μm to 750 μm.

The transparent substrate layer 41 is, for example, glass with good light transmittance, especially having good light transmittance for the visible light range and little change with wavelength, so as to reduce a light loss of incident light entering the liquid crystal space and exiting. The glass substrate layer 41 may be quartz glass.

A material of the transparent conductive layer 42 is, for example, indium tin oxide (ITO), fluorine-doped tin oxide ($SnO_2$: F, FTO), aluminum-doped zinc oxide (ZnO: Al, AZO), or other oxide including at least one element of indium, antimony, zinc and cadmium. The transparent conductive layer 42 is electrically connected to the active circuit 12, and the active circuit 12 controls the electrical level of the entire transparent conductive layer 42 by outputting a voltage, thereby forming an electric field between the transparent conductive layer 42 and the reflection electrodes of the active circuit 12 to control the orientation of liquid crystal molecules.

In the present embodiment, the upper and lower sides of the liquid crystal layer are respectively provided with a first alignment layer 113 and a second alignment layer 43. The first alignment layer 113 is a part of the wafer substrate 10 and is located above the active circuit 12. The second alignment layer 43 is a part of the transparent substrate 40 and is located below the transparent conductive layer 42. The first alignment layer 113 and the second alignment layer 43 are configured for initializing an orientation of liquid crystal molecules in the liquid crystal space 30. A material of the alignment layer is, for example, polyimide or silicon oxide.

In one embodiment, the seal 20 has a plurality of spacers for providing mechanical support.

In one embodiment, the seal 20 includes at least one closed liquid crystal injecting port arranged on a side of the LCoS panel 100. This embodiment corresponds to the technical solution of injecting liquid crystal in step D in the above embodiment of the preparation method.

In the LCoS panel, the wafer substrate 10 has vias 50 extending through the silicon substrate 11, which is connected to the vias 50, the input/output terminals 13 and the active circuit 12 by the conductive interfaces 14 on the backside of the wafer substrate 10, so that the production of the LCoS panels can use the production line of passive LCD panels to perform the process of liquid crystal space packaging from the frontside of the wafer substrate 10, thereby reducing the cost of equipment investment. In addition, the TSV technology is used on the wafer substrate 10 to form vias 50 extending through the silicon substrate 11, so that the LCoS panel 100 is directly connected to the external circuit substrate by the conductive interfaces 14 without FPC lines wires, thus improving the signal processing speed and saving the cost.

In the present embodiment, each via 50 includes at least a patterned dielectric layer 51, a patterned conductive layer 52, and a pattern passivation layer 53. In FIG. 2, each via 50 further includes the pattern passivation layer 53. The pattern passivation layer 53 is on the second surface 114 of the silicon substrate 11 and forms protrusions on the side of second surface 114 for carrying the patterned conductive layer 52 and the conductive interface 14.

In the present embodiment, a depth to width ratio of each via 50 ranges from 5:1 to 10:1.

As shown in FIG. 2, a projection of the vias 50 on the wafer substrate 10 does not intercept and surrounds the pixel circuit area of the active circuit 12, which can be considered to include at least an area below the liquid crystal space 30. For the case where the number of vias is multiple, each via does not intercept the pixel circuit area. Accordingly, in the manufacturing process, in the above embodiments of the preparation method, in the step of circuit packaging (i.e., step C), for each die area 10a, a projection of the manufactured plurality of vias 50 on the wafer substrate 10 does not intercept and surrounds the pixel circuit area.

In some embodiments of the present disclosure, the projection of the vias 50 on the wafer substrate 10 does not intercept and surrounds the peripheral circuit area. As shown in FIG. 2, a portion of the active circuit 12 directly below the seal 20 can be considered as a portion of the peripheral circuit, and two vias 50 shown in the figure avoid the portion of the peripheral circuit. Accordingly, in the manufacturing process, in the above embodiments of the preparation method, in step C of the circuit packaging, for each die area 10a, the projection of the manufactured plurality of vias 50 on the wafer substrate 10 does not intercept and surrounds the peripheral circuit area.

In another embodiment of the present disclosure, some vias can be arranged in the peripheral circuit area, so that a layout design of the peripheral circuit is flexible, and it is also beneficial to increase the transmission rate of the circuit corresponding to the vias.

In another embodiment, in the preparation method of the LCoS panel, the active circuit 12 includes a plurality of metal layers, and the plurality of metal layers include a plurality of input/output terminals 13 located at different locations. Each via 50 is vertically connected to a different input/output terminal 13 of the metal layer, thereby achieving electrical connection with the pixel circuit area and/or the peripheral circuit area.

As shown in FIG. 2, the wafer substrate 10 further includes a plurality of conductive pads 17 spaced apart from each other on the first surface 112 of the silicon substrate 11. The conductive pads 17 are electrically connected to the active circuit 12. For at least some of the vias 50, there is a corresponding one of the conductive pads 17 electrically connected to. Additionally, in the manufacturing process, the conductive pads 17 can be used to test the active circuit 12 during the preparation of the LCoS panel. The technical solution is advantageous to testing the active circuit 12 without damaging the conductive interfaces 14 (for example, it is not necessary to weld the conductive interfaces to a test device), and the test can be performed from the frontside of the wafer (a side of the first surface). The operation is convenient.

In some embodiments of the present disclosure, each via 50 is electrically connected to a unique conductive pad 17. In that case, it is possible to test whether the circuit corresponding to each conductive interface 14 works normally by using the conductive pads 17 as the input and output interfaces.

In some embodiments, the wafer substrate 10 further includes independent conductive pads 17. The conductive pad 17 on the right side as in FIG. 2, on the one hand, is electrically connected the active circuit 12, on the other hand, is electrically connected to the transparent conductive layer 42 of the transparent substrate 40 by a conductive adhesive 60, thus providing a voltage to the transparent conductive layer 42 as a conductor.

In some embodiments of the present disclosure, at least some of the vias 50 are electrically connected to a corresponding one of the conductive pads 17, and a projection of each conductive pad 17 and a corresponding one of the vias 50 are staggered on the wafer substrate 10. The technical solution makes a physical connection between the conductive pads and the active circuit relatively independent of a physical connection between the vias and the active circuit, which makes the circuit layout flexible.

In another embodiment, the projection of each conductive pad 17 and the corresponding via 50 is on the wafer substrate 10 (such as the conductive pad and via on the left side of FIG. 2). The technical solution reduces the number of input/output terminals 13 that need to be provided on the metal layer, so that the conductive pads 17 and the vias 50 can be connected to the same input/output terminal 13 at the same time, which is beneficial to reducing the overall size of the LCoS panel 100.

In the present disclosure, the conductive interface 14 includes at least one of BGA, PGA and LGA. The above types of packaging structure can enable the LCoS panel 100 to be connected to an external circuit substrate in a vertical direction. Since there is a heating process in the installation mode of the BGA, which may damage the liquid crystal, the connection mode of PGA or LGA is preferred.

From the perspective of the installation temperature of the LCoS panel 100, the preparation method of the present disclosure preferably adopts a lower temperature installation method. In one embodiment of the present disclosure, the conductive interfaces 14 are electrically connected to the external circuit substrate by means of mechanical pressing or mechanical coupling. Furthermore, the LCoS panel and the external circuit substrate can be further fixed by clasping, thus improving the connection reliability of mechanical pressing or mechanical coupling.

In the present embodiment, the projection of at least some of the conductive interfaces 14 on the wafer substrate 10 is closer to the center of the LCoS panel 100 than the projection of the vias 50 corresponding to the conductive interfaces 14 on the wafer substrate. By connecting the vias 50 with the conductive interfaces 14 using the circuit on the second surface 114 of the silicon substrate 11 of the wafer substrate 10, some conductive interfaces 14 can be distributed in the position of the corresponding pixel circuit area of the active circuit 12, which does not intercept overcrowding of the conductive interfaces 14 at the edge. At the same time, a size of the conductive interfaces 14 can be enlarged, and higher transmission efficiency can be obtained. The conductive interfaces 14 on the second surface 114 may be arranged in a uniform manner or a non-uniform manner, not illustrated here.

The above embodiments are only used to illustrate the technical solutions of the present disclosure and not to limit them. Although the present disclosure has been described in detail with reference to the preferred embodiments, those of ordinary skill in the art should understand that the technical solutions of the present disclosure can be modified or equivalently replaced without departing from the spirit and scope of the technical solutions of the present disclosure.

What is claimed is:

1. A preparation method of a liquid crystal on silicon (LCoS) panel, comprising:
   step A, providing a wafer substrate, wherein the wafer substrate comprises a silicon substrate and a plurality of die areas defined by a plurality of intersecting dividing lines, the silicon substrate comprises a first surface and a second surface opposite to the first surface, each of the plurality of die areas comprises an active circuit on the first surface, and the active circuit comprises a pixel circuit area and a peripheral circuit area;
   step B, forming a seal on a side of the first surface in each of the plurality of die areas of the wafer substrate, wherein the seal at least surrounds the pixel circuit area of the active circuit, and defines a liquid crystal space of each of the plurality of die areas where the seal is located; providing a transparent substrate comprising a transparent conductive layer, and coupling a surface of the transparent substrate with the transparent conductive layer and the wafer substrate by the seal;
   step C, thinning the silicon substrate to a first thickness ranging from 220 μm to 500 μm; manufacturing a plurality of vias extending through the first surface and the second surface in each of the plurality of die areas of the wafer substrate; and manufacturing a plurality of conductive interfaces on the second surface, wherein each of the plurality of conductive interfaces is arranged to correspond to one of the plurality of vias, and is electrically connected to the active circuit of one of the plurality of die areas where the conductive interface is located by a corresponding one of the plurality of vias; and
   step D, cutting the wafer substrate along the plurality of dividing lines, and correspondingly cutting the transparent substrate to obtain a plurality of LCoS panels;
   wherein in the step C, projections of the plurality of vias manufactured on the wafer substrate surround but do not intercept with the pixel circuit area in each of the plurality of die areas.

2. The preparation method of the LCoS panel of claim 1, wherein order of the step B and the step C is exchanged.

3. The preparation method of the LCoS panel of claim 1, wherein the step B further comprises injecting liquid crystal into the liquid crystal space after the forming the seal and before the coupling the transparent substrate.

4. The preparation method of the LCoS panel of claim 1, wherein the step D further comprises injecting liquid crystal into the liquid crystal space after the cutting the wafer substrate and the transparent substrate.

5. The preparation method of the LCoS panel of claim 1, wherein a depth to width ratio of each of the plurality of vias ranges from 5:1 to 10:1.

6. The preparation method of the LCoS panel of claim 5, wherein in the step C, manufacturing the plurality of vias comprises drilling a plurality of blind-holes on the silicon substrate by laser, and etching the plurality of blind-holes by reactive ion etching.

7. The preparation method of the LCoS panel of claim 1, wherein in the step C, manufacturing the plurality of vias comprises forming a plurality of grooves on the second surface of the silicon substrate, and forming the plurality of vias in the plurality of grooves.

8. The preparation method of the LCoS panel of claim 1, wherein the active circuit comprises a plurality of metal layers, and the plurality of metal layers comprises a plurality of input/output terminals located at different positions, each of the plurality of vias is vertically connected to a different input/output terminal of the plurality of input/output terminals, thus electrically connecting the active circuit.

9. The preparation method of the LCoS panel of claim 8, wherein in the step C, manufacturing the plurality of vias comprises:
   manufacturing a plurality of through holes extending through the first surface and the second surface in each of the plurality of die areas, the plurality of through holes exposing the plurality of input/output terminals;
   manufacturing a dielectric layer covering inner walls of the plurality of through holes and a part of the second surface, etching the dielectric layer to expose the plurality of input/output terminals, thereby obtaining a patterned dielectric layer;
   manufacturing a patterned conductive layer covering a part of the patterned dielectric layer, the patterned conductive layer covering the input/output terminals from the second surface, and a part of the patterned conductive layer extending to the second surface; and
   manufacturing a pattern passivation layer covering a part of the patterned conductive layer from the second surface.

10. The preparation method of the LCoS panel of claim 9, wherein in the step C, manufacturing the plurality of conductive interfaces in an area where the patterned conductive layer is not covered by the pattern passivation layer.

11. The preparation method of the LCoS panel of claim 1, wherein the plurality of conductive interfaces comprises at least one of a ball grid array package structure, a pin grid array structure, and a grid array package structure.

12. An LCoS panel, comprising:
a wafer substrate comprising:
  a silicon substrate comprising a first surface and a second surface opposite to the first surface, the first surface comprising an active circuit, the active circuit comprising a pixel circuit area and a peripheral circuit area, the second surface comprising a plurality of conductive interfaces, and a thickness of the silicon substrate ranges from 220 um to 500 um; and
  a plurality of vias extending through the first surface and the second surface, wherein each of the plurality of conductive interfaces is arranged to correspond to one of the plurality of vias, and is electrically connected to the active circuit by a corresponding via; and
a transparent substrate comprising a transparent conductive layer, the transparent substrate being opposite to the wafer substrate;
a seal between the wafer substrate and the transparent substrate, wherein the seal surrounds the pixel circuit area of the active circuit and defines a liquid crystal space; and
a liquid crystal injected in the liquid crystal space;
wherein the plurality of conductive interfaces electrically connects the LCoS panel to an external circuit substrate, and projections of the plurality of vias on the wafer substrate surround but do not intercept with the pixel circuit area.

13. The LCoS panel of claim 12, wherein the thickness of the silicon substrate ranges from 300 μm to 400 μm.

14. The LCoS panel of claim 12, wherein a depth to width ratio of each of the plurality of vias ranges from 5:1 to 10:1.

15. The LCoS panel of claim 12, wherein the seal comprises a closed liquid crystal injecting port formed on one side of the LCoS panel.

* * * * *